United States Patent
Lee et al.

(10) Patent No.: US 10,357,951 B2
(45) Date of Patent: Jul. 23, 2019

(54) LAMINATING APPARATUS AND LAMINATING METHOD USING THE SAME

(71) Applicant: SAMSUNG DISPLAY CO., LTD., Yongin-si, Gyeonggi-do (KR)

(72) Inventors: Soochan Lee, Asan-si (KR); Hirokazu Ishii, Asan-si (KR); Katsuhiko Tanaka, Cheonan-si (KR); Jeonghun Heo, Asan-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 107 days.

(21) Appl. No.: 15/714,364

(22) Filed: Sep. 25, 2017

(65) Prior Publication Data
US 2018/0093464 A1    Apr. 5, 2018

(30) Foreign Application Priority Data
Oct. 5, 2016 (KR) .................. 10-2016-0128375

(51) Int. Cl.
| | |
|---|---|
| *G02F 1/13* | (2006.01) |
| *B32B 37/00* | (2006.01) |
| *B32B 37/10* | (2006.01) |
| *B32B 37/12* | (2006.01) |
| *B32B 38/18* | (2006.01) |
| *G02F 1/1333* | (2006.01) |

(52) U.S. Cl.
CPC .......... *B32B 37/1018* (2013.01); *B32B 37/12* (2013.01); *B32B 37/003* (2013.01); *B32B 37/0046* (2013.01); *B32B 38/1866* (2013.01); *B32B 2307/51* (2013.01); *B32B 2457/20* (2013.01); *B32B 2457/202* (2013.01); *B32B 2457/206* (2013.01); *B32B 2457/208* (2013.01); *G02F 1/1303* (2013.01); *G02F 2001/133331* (2013.01); *H01L 2251/5338* (2013.01); *Y10T 156/1028* (2015.01)

(58) Field of Classification Search
CPC ........... B32B 38/1866; B32B 37/0046; B32B 37/003; B32B 2457/20; B32B 2457/202; B32B 2457/206; B32B 2457/208; H01L 2251/5338; G02F 1/1303; G02F 2001/133331; Y10T 156/1028
USPC .................................................. 156/228, 475
See application file for complete search history.

(56) References Cited

U.S. PATENT DOCUMENTS

| | | | |
|---|---|---|---|
| 2013/0313224 A1* | 11/2013 | Mai ........................ | B32B 38/10 216/20 |
| 2014/0345792 A1* | 11/2014 | Lee ...................... | B32B 37/0046 156/228 |

(Continued)

FOREIGN PATENT DOCUMENTS

| | | |
|---|---|---|
| JP | 3546333 | 7/2004 |
| JP | 5344870 | 11/2013 |

*Primary Examiner* — Carson Gross
(74) *Attorney, Agent, or Firm* — F. Chau & Associates, LLC

(57) ABSTRACT

A laminating apparatus includes a first jig having at least one recessed portion, a second jig disposed opposite to the first jig, a step difference portion disposed on the second jig, an elastic sheet disposed on each of the second jig and the step difference portion, and a guide portion spaced apart from the step difference portion and overlapping an edge of the elastic sheet. A width of the step difference portion is greater than a width of the recessed portion of the first jig.

22 Claims, 6 Drawing Sheets

(56) References Cited

U.S. PATENT DOCUMENTS

2014/0377508 A1* 12/2014 Oh .................... B32B 37/10
                                                    428/174
2016/0088398 A1   3/2016 Kim et al.

* cited by examiner

LAMINATING APPARATUS AND LAMINATING METHOD USING THE SAME

CROSS-REFERENCE TO RELATED APPLICATION

This application claims priority under 35 U.S.C. § 119 to Korean Patent Application No. 10-2016-0128375, filed on Oct. 5, 2016 in the Korean Intellectual Property Office, the disclosure of which is incorporated by reference herein in its entirety.

TECHNICAL FIELD

Exemplary embodiments of the present invention relate to a laminating apparatus, and more particularly to a laminating method using the same.

DISCUSSION OF RELATED ART

Display devices may include a liquid crystal display ("LCD") device, an organic light-emitting diode ("OLED") display device, a plasma display panel ("PDP") device, an electrophoretic ("EPD") device, etc., according to a light-emitting scheme thereof.

Electronic devices having mobility are widely in use. Recently, tablet personal computers (PCs) have been used as mobile electronic devices in addition to small electronic devices such as mobile phones.

Such a mobile electronic device includes a display device to provide users with visual information such as an image or a video. As the shape of electronic devices has varied, a curved display device has been developed. Thus, there is a use for a laminating device applicable to the curved display device.

A laminating apparatus for manufacturing curved display devices may include an elastic member. For example, by including an elastic sheet which is flexible, a display panel and a window panel of the curved display device may be pressed to be laminated. Thus, the position of the display panel on the elastic sheet may change when the elastic sheet expands. As a result, a misalignment between the window panel and the display panel may occur.

SUMMARY

Exemplary embodiments of the present invention provide a laminating apparatus. The laminating apparatus may substantially reduce an amount of change of a length of an elastic sheet. Thus, a misalignment between laminating objects may be minimized or prevented. Exemplary embodiments of the present invention also provide a laminating method including the same.

Exemplary embodiments of the present invention provide a laminating apparatus. The laminating apparatus includes a first jig, a second jig, a step difference portion, an elastic sheet, and a guide portion. The first jig includes at least one recessed portion. The second jig is disposed opposite to the first jig. The step difference portion is disposed on the second jig. The elastic sheet is disposed on each of the second jig and the step difference portion. The guide portion is spaced apart from the step difference portion. The guide portion overlaps an edge of the elastic sheet. A width of the step difference portion is greater than a width of the recessed portion of the first jig.

The laminating apparatus may further include a fluid regulating portion. The fluid regulating portion may supply a fluid between the step difference portion and the elastic sheet. The fluid supplied between the step difference portion and the elastic sheet may adjust a height of the elastic sheet.

The first jig may include at least one first hole. Each of the second jig and the step difference portion may include at least one second hole.

The first jig may include an accommodating groove. The accommodating groove may be disposed at a portion of the first jig aligned with the guide portion.

The first jig may fasten a first laminating object to the at least one recessed portion.

The first laminating object may include a substantially flat portion and a curved portion. The curved portion may extend from the substantially flat portion.

The first laminating object may be a window panel.

A second laminating object may be disposed on the elastic sheet.

The second laminating object may be a display panel.

A contact area between the guide portion and the first jig may be larger than a contact area between the guide portion and the elastic sheet.

The guide portion may have an inclined surface. The inclined surface may contact a side portion of the second laminating object.

The step difference portion may have a parabolic shape on a cross section.

The step difference portion may be formed integrally with the second jig.

Exemplary embodiments of the present invention provide a laminating method. The laminating method includes disposing a first laminating object on a first jig having at least one recessed portion. A second laminating object is disposed on a second jig. A step difference portion is disposed on the second jig. The second jig is disposed opposite to the first jig. A gap between the first jig and the second jig is narrowed. A pressure is applied to the second laminating object by supplying a fluid to an area below an elastic sheet. The elastic sheet is disposed on the second jig and the step difference portion. A width of the step difference portion is greater than a width of the at least one recessed portion of the first jig.

An edge of the elastic sheet may be fastened to the second jig by a guide portion. The guide portion may be spaced apart from the step difference portion.

The first jig may include an accommodating groove. The accommodating groove may be disposed at a portion of the first jig aligned with the guide portion.

The guide portion may include an inclined surface. The inclined surface may contact a side portion of the second laminating object.

The first jig may further include vacuum-adsorbing the first laminating object using at least one first hole disposed in the first jig.

The method may further include discharging the fluid supplied to the area below the elastic sheet.

The step difference portion may be formed integrally with the second jig.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION OF THE EMBODIMENTS

Figure 1:
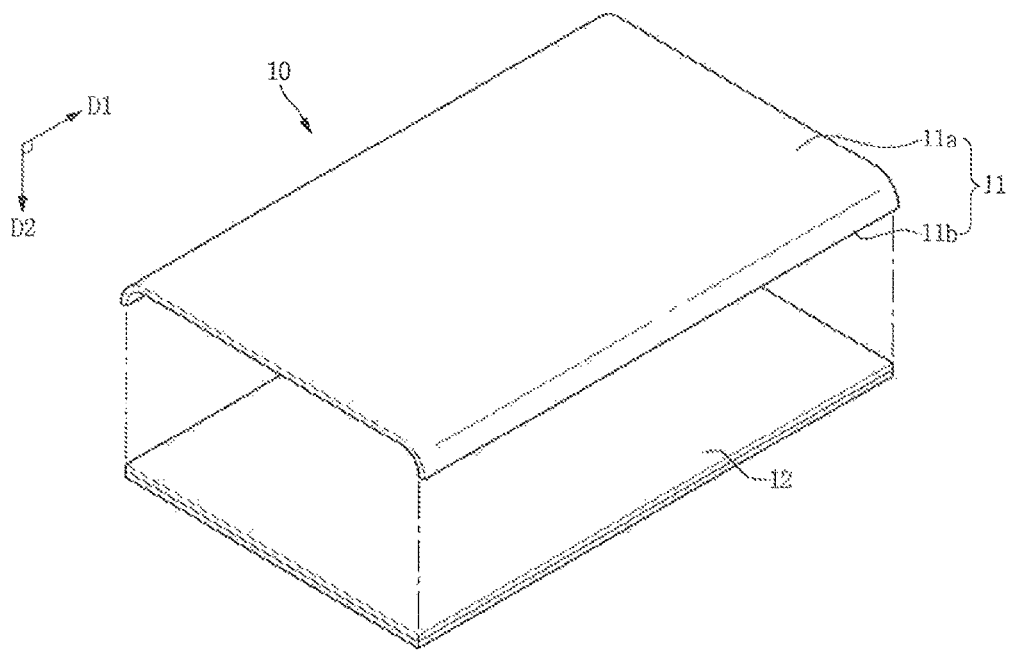
FIG. 1 is a perspective view illustrating a curved display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

It will be understood that when a component, such as a layer, a film, a region, or a plate, is referred to as being "on" another component, the component can be directly on the other component or intervening components may be present.

FIG. 1 is a perspective view illustrating a curved display device according to an exemplary embodiment of the present invention.

Referring to FIG. 1, a curved display device 10 may include a window panel 11 and a display panel 12.

The window panel 11 may be substantially transparent. The window panel 11 may have a planar plate shape. The window panel 11 may include a transparent material such as glass, polyethylene terephthalate (PEI), or acryl. The term "transparent" as used herein may refer to transmissivity that includes about 100% of light transmission and a semi-transmissivity that includes partial light transmission.

The window panel 11 may include a flat portion 11a and a curved portion 11b. Referring to FIG. 1, the window panel 11 may include the curved portion 11b extending in a first direction D1, and the flat portion 11 a may be disposed between the curved portions 11b. Thus, the curved portion 11b may be curved from opposite sides of the flat portion 11a in a second direction D2 to extend therefrom.

The display panel 12 may be a display panel for displaying an image. The display panel 12 may include a liquid crystal display ("LCD") panel, an electrophoretic display panel, an organic light-emitting diode ("OLED") panel, a light-emitting diode ("LED") panel, an inorganic electro luminescent ("EL") display panel, a field emission display ("FED") panel, a surface conduction electron-emitter display ("SED") panel, a plasma display panel (PDP), a cathode ray tube (CRT) display panel, etc.

However, the types of the display panel 12 are not limited thereto. Further, the display panel may be a rigid panel or a flexible panel. The flexible panel may be bent, folded, or rolled.

The display panel 12 may include a touch screen panel (TSP). The touch screen panel may be various types of touch panels.

According to an exemplary embodiment of the present invention, the window panel 11 may include the flat portion 11a and the curved portion 11b. Additionally, the display panel 12 may be bent corresponding to the shape of the window panel 11. Thus, when the window panel 11 and the display panel 12 are laminated, the window panel 11 and the display panel 12 may overlap each other. For example, in an exemplary embodiment of the present invention, the window panel 11 and the display panel 12 may entirely overlap each other. As a result, the display panel 12 may be at least partially flexible. A portion of the display panel 12 corresponding to the curved portion 11b of the window panel 11 may be partially curved.

An adhesive layer may be disposed between the window panel 11 and the display panel 12. The adhesive layer may include a thermosetting adhesive or a ultraviolet (UV) curable adhesive. However, exemplary embodiments of the present invention are not limited thereto. For example, an optically clear adhesive (OCA) or an optically clear resin (OCR) tape may be disposed between the window panel 11 and the display panel 12.

A laminating apparatus according to exemplary embodiments of the present invention will be described in more detail below.

According to one or more exemplary embodiments of the present invention, the laminating apparatus may be applied to the display panel 12 having a substantially flat shape. The display panel 12 may be attached to the window panel 11. The window panel 11 may have a transverse direction shorter than a longitudinal direction (e.g., a portrait-type shape). The window panel 11 may be curved in a longitudinal direction. However, exemplary embodiments of the present invention are not limited thereto. For example, the laminating apparatus may be applied to a window panel 11 having a transverse direction longer than a longitudinal direction (e.g., a landscape-type shape), and that is curved in a transverse direction.

The laminating apparatus according to an exemplary embodiment of the present invention may attach a first laminating object and a second laminating object to each other. In such an exemplary embodiment of the present invention, the first laminating object may be the window panel 11, and the second laminating object may be the display panel 12. However, exemplary embodiments of the present invention are not limited to use with a window panel 11 and a display panel 12. For example, according to an exemplary embodiment of the present invention, the laminating apparatus may be applied to any rigid material having a curved portion attached to a flexible material.

Figure 2:
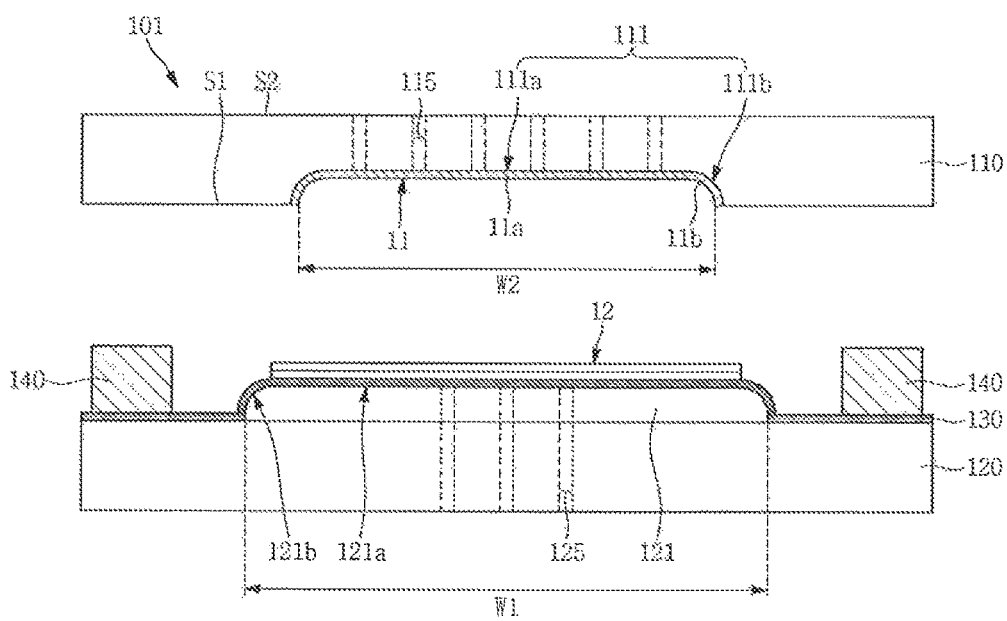
FIG. 2 is a cross-sectional view illustrating a laminating apparatus according to an exemplary embodiment of the present invention.

FIG. 2 is a cross-sectional view illustrating a laminating apparatus according to an exemplary embodiment of the present invention.

Referring to FIG. 2, the laminating apparatus 101 may include a first jig 110, a second jig 120, a step difference portion 121, an elastic sheet 130, and a guide portion 140.

The first jig 110 has at least one recessed portion 111. The first jig 110 may include a first surface S1 and a second surface S2. The first surface S1 may face the second jig 120. The second surface S2 may be disposed on the opposite side of the first surface S1. The first jig 110 may include at least one recessed portion 111, for example, in the first surface S1.

The first jig 110 may fasten the window panel 11 to the recessed portion 111. The window panel 11 may include a relatively rigid material. The window panel 11 may have a curved surface.

The recessed portion 111 of the first jig 110 may have a size and a shape corresponding to the window panel 11. For example, referring to FIGS. 1 and 2, when the window panel 11 includes the flat portion 11a and the curved portion 11b, the recessed portion 111 of the first jig 110 may have a first flat surface portion 111a and a first curved surface portion 111b. The first flat surface portion 111a may correspond to the flat portion 11a of the window panel 11. The first curved surface portion 111b may correspond to the curved portion 11b of the window panel 11.

The first jig 110 may have at least one first hole 115, for example, for vacuum-adsorbing the window panel 11. The first hole 115 may be connected to a vacuum pump. The vacuum pump may be configured to provide a force for adsorption through the first hole 115. Although the first jig 110 may affix the window panel 11 to the recessed portion 111 in a vacuum adsorption manner, exemplary embodiments of the present invention are not limited thereto.

The first jig 110 may move in a vertical direction, for example, to adjust a distance with respect to the second jig 120. In addition, the first jig 110 may rotate. For example, the first jig 110 may rotate about 180 degrees such that the second surface S2 of the first jig 110 is positioned in a lower position and faces the second jig 120. The first surface S1 may be positioned in an upper position opposite to the second surface S2. Accordingly, the recessed portion 111 of the first jig 110 may be positioned at an upper portion of the laminating apparatus 101. Thus, the window panel 11 may be mounted on the recessed portion 111.

The second jig 120 may be disposed below or above the first jig 110. The second jig 120 may have a planar plate shape. A horizontal area of the second jig 120 may be substantially equal to or larger than a horizontal area of the first jig 110.

The step difference portion 121 may be disposed on the second jig 120.

The step difference portion 121 may be disposed at a central portion of the second jig 120. The step difference portion 121 may include a second flat surface portion 121a and a second curved surface portion 121b. The second flat portion 121a may support the display panel 12. The second curved portion 121b may extend from the second flat surface portion 121a. The elastic sheet 130 may be disposed on the second curved portion 121b and the second flat surface portion 121a. However, the shape of the step difference portion 121 is not limited thereto. For example, the step difference portion 121 may have various cross-sectional shapes such as an upwardly-facing convex parabolic shape or a hemispherical shape.

The step difference portion 121 may have a width larger than a width of the recessed portion 111 of the first jig 110. For example, when a width of the step difference portion 121 is a first width W1 and a width of the recessed portion 111 is a second width W2, the first width W1 may be larger than the second width W2. A length of the display panel 12 overlapping the second flat surface portion 121a of the step difference portion 121 may be substantially equal to a length of the window panel 11 including the flat portion 11a and the curved portion 11b. Since the step difference portion 121 may have a width greater than the width of the recessed portion 111 of the first jig 110, the step difference portion 121 may stably support the display panel 12.

Although the step difference portion 121 may be a separate structure disposed on the second jig 120, exemplary embodiments of the present invention are not limited thereto. For example, the step difference portion 121 and the second jig 120 may be integrally formed. For example, in an exemplary embodiment of the present invention, the step difference portion 121 may be a protruding portion of the second jig 120.

The second jig 120 and the step difference portion 121 have at least one second hole 125. The second hole 125 may supply a fluid between the step difference portion 121 and the elastic sheet 130. The second hole 125 may discharge the fluid supplied between the step difference portion 121 and the elastic sheet 130. The second hole 125 may be connected to a fluid regulating portion. The fluid regulating portion may supply the fluid between the step difference portion 121 and the elastic sheet 130, for example, through the second hole 125. A height of the elastic sheet 130 may be adjusted, for example, by the fluid supplied by the fluid regulating portion.

The elastic sheet 130 may be disposed on the second jig 1.20 and the step difference portion 121.

The elastic sheet 130 may be deformed by an external force. Thus, the elastic sheet 130 may have an elastic force and a restoring force. The shape of the elastic sheet 130 may be changed according to the applied force. When the applied force is removed, the elastic sheet 130 may be restored to the state before applying the force.

The elastic sheet 130 may include a material having an elastic force and a restoring force. The elastic sheet 130 may include at least one material selected from rubber, urethane, synthetic resin, or silicone. However, exemplary embodiments of the present invention are not limited thereto.

The guide portion 140 may be disposed on the elastic sheet 130. The guide portion 140 may fasten an edge of the elastic sheet 130 to the second jig 120.

The guide portion 140 may be spaced apart from the step difference portion 121. The guide portion 140 may overlap the elastic sheet 130, for example, along the edge of the elastic sheet 130. For example, the guide portion 140 may have a circular or quadrangular ring shape. Thus, the guide portion 140 may define a space having a circular shape or a quadrangular shape, and the step difference portion 121 and the display panel 12 may be disposed to be separated from the guide portion 140.

FIGS. 3A, 3B, 3C and 3D are views illustrating a laminating method using the same according to an exemplary embodiment of the present invention.

Figure 3A:
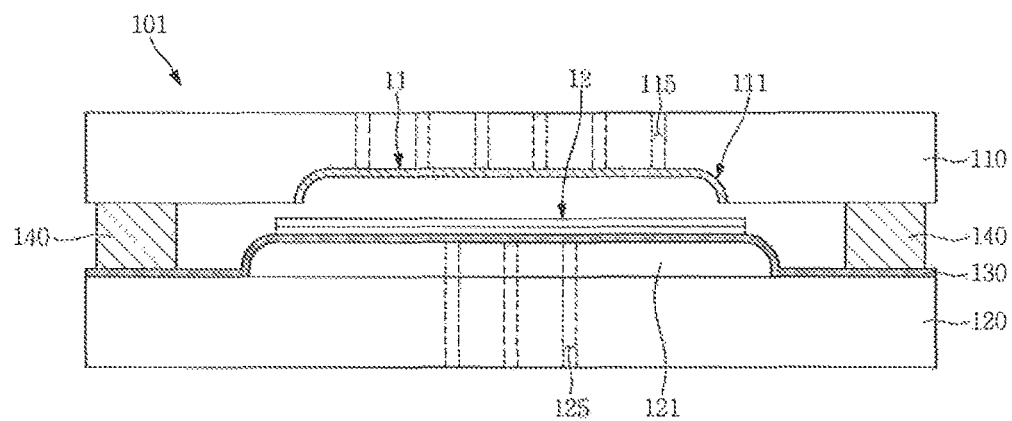
FIGS. 3A, 3B, 3C and 3D are views illustrating a laminating method using the same according to an exemplary embodiment of the present invention.

Referring to FIG. 3A, the window panel 11 may be fastened to the recessed portion 111 of the first jig 110. The display panel 12 may be disposed on the elastic sheet 130. The first jig 110 may fasten the window panel 11 to the recessed portion 111, for example, by a vacuum adsorption method using the first hole 115. However, the fastening method is not limited thereto.

According to an exemplary embodiment of the present invention, the window panel 11 may be aligned with the display panel 12. For example, a position of the display panel 12 on the elastic sheet 130 may be adjusted, for example, in order to prevent misalignment of the window panel 11 and the display panel 12.

A distance between the first jig 110 and the second jig 120 may decrease. According to an exemplary embodiment of the present invention, the first jig 110 may descend and/or the second jig 120 may ascend. The first jig 110 may descend, for example, until a lower surface of the first jig 110 contacts an upper surface of the guide portion 140 disposed on the second jig 120. The second jig 120 may ascend, for example, until the upper surface of the guide portion 140 on the second jig 120 contacts the lower surface of the first jig 110. The first jig 110 and the second jig 120 may descend and ascend, respectively, at substantially the same time or at different times. Accordingly, an inner space of the laminating apparatus 101 may be sealed between the first jig 110 and the elastic sheet 130, for example, by the guide portion 140. The guide portion 140 may be disposed along the edge of the elastic sheet 130.

Figure 3B:
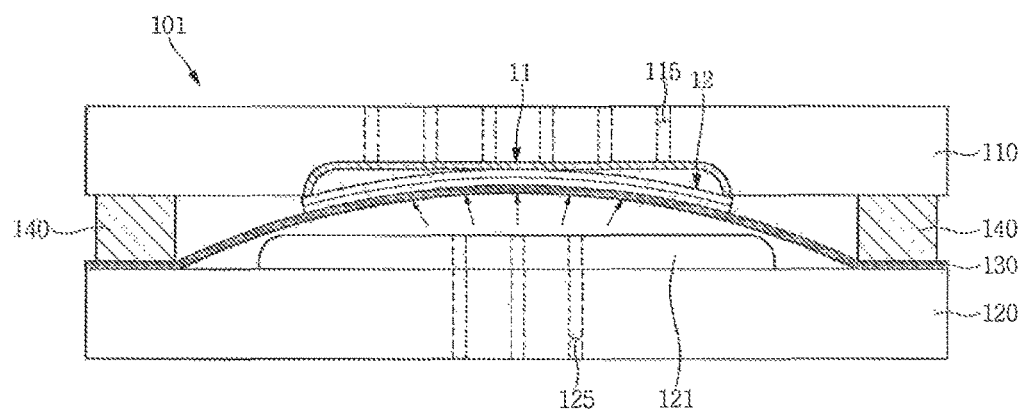

Referring to FIG. 3B, the fluid regulating portion may supply a fluid between the step difference portion 121 and the elastic sheet 130, for example, to increase a height of the elastic sheet 130. Thus, the fluid supplied by the fluid regulating portion may be supplied through the second hole 125 between the step difference portion 121 and the elastic sheet 130 such that the elastic sheet 130 gradually expands. Accordingly, the elastic sheet 130 may become gradually further away from the second jig 120 and the step difference portion 121. The display panel 12 disposed on the elastic sheet 130 may become gradually closer to the window panel 11 fastened to the first jig 110.

According to an exemplary embodiment of the present invention, the fluid may include one element selected from compressed air, nitrogen, water, or lubricating oil. Further, a pressure applied to the elastic sheet 130 by the fluid may be substantially uniformly distributed over the area of the elastic sheet 130.

Figure 3C:
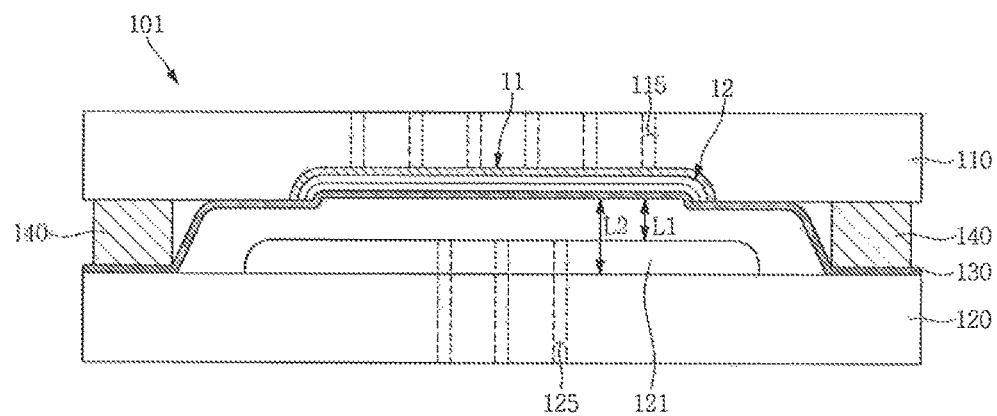

Referring to FIG. 3C, the elastic sheet 130 may expand until a lower surface of the window panel 11 and an upper surface of the display panel 12 are attached to each other (e.g., completely attached to each other). The elastic sheet 130 may reduce a laminating process time by having the step difference portion 121 disposed below the elastic sheet 130. For example, when a state illustrated in FIG. 3A in which the elastic sheet 130 is in contact with the second jig 120 and the step difference portion 121 is as an initial state, and a state illustrated in FIG. 3C in which the elastic sheet 130 expands to a substantially maximum extent is as a maximum expansion state, a processing time for advancing from the initial state to the maximum expansion state may be reduced by disposing the step difference portion 121 below the elastic sheet 130.

When a distance between an upper surface of the step difference portion 121 and a lower surface of the elastic sheet 130 is referred to as a first distance L1 and a distance between an upper surface of the second jig 120 and the lower surface of the elastic sheet 130 is referred to as a second distance L2, the first distance L1 may be smaller than the second distance L2. Thus, an amount of change of the elastic sheet 130 when the step difference portion 121 is disposed on the second jig 120 may be less than an amount of change of the elastic sheet 130 when the step difference portion 121 is not provided on the second jig 120.

As the laminating apparatus 101 includes the step difference portion 121 between the second jig 120 and the elastic sheet 130, the amount of change of the length of the elastic sheet 130 (e.g., the height of the elastic sheet 130 in a cross-sectional view) may be reduced in the laminating process. Further, as the amount of change of the length of the elastic sheet 130 (e.g., the height of the elastic sheet 130 in a cross-sectional view) is reduced during the process, a change in the position of the display panel 12 on the elastic sheet 130 may be substantially reduced. Thus, misalignment between the window panel 11 and the display panel 12 may be substantially reduced or prevented.

Figure 3D:
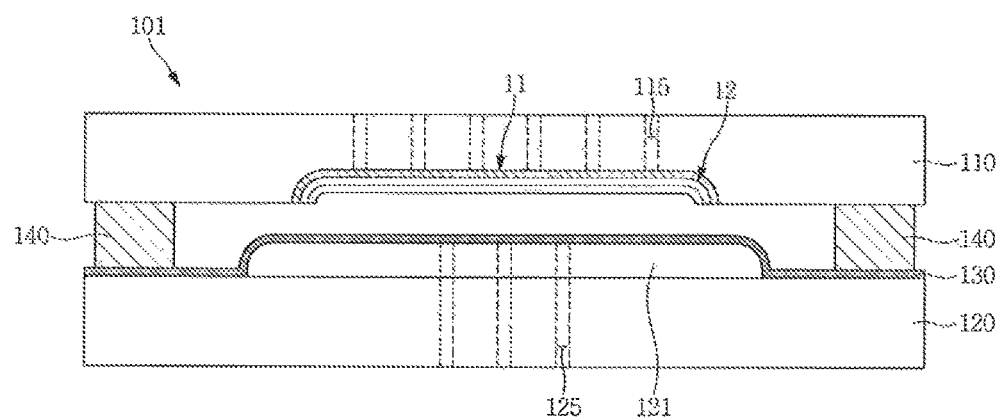

Referring to FIG. 3D, the fluid supplied between the step difference portion 121 and the elastic sheet 130 may be discharged through the second hole 125. As a result, the height of the elastic sheet 130 may be reduced. When the display panel 12 is attached to the window panel 11, the display panel 12 may be fastened to the first jig 110. Thus, the height of the elastic sheet 130 may be reduced such that the elastic sheet 130 may become gradually closer to the second jig 120 and the step difference portion 121.

Since the laminating apparatus 101 may include the step difference portion 121 between the second jig 120 and the elastic sheet 130, the laminating process time may be reduced and the amount of change of the elastic sheet 130 may be reduced during the laminating process. In addition, misalignment between the window panel 11 and the display panel 12 may be substantially reduced or prevented. As a result, the reliability of the curved display device 10 may be increased.

Figure 4A:
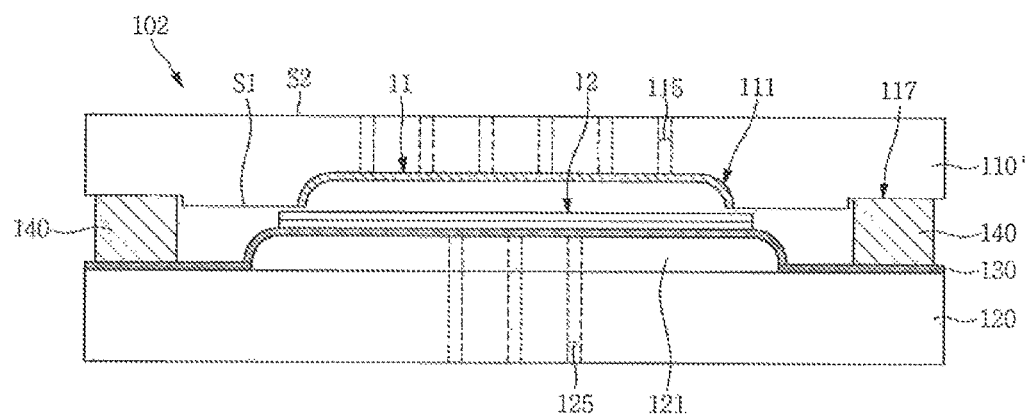
FIGS. 4A and 4B are views illustrating a laminating apparatus and a laminating method using the same according to an exemplary embodiment of the present invention.
Figure 4B:
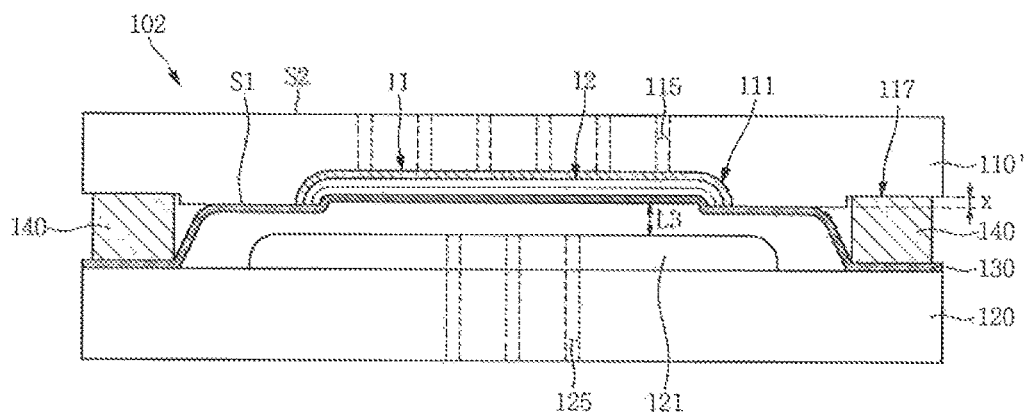

FIGS. 4A and 4B are views illustrating a laminating apparatus and a laminating method using the same according to an exemplary embodiment of the present invention. The descriptions of exemplary embodiments of the present invention previously described may be omitted.

Referring to FIGS. 4A and 4B, a laminating apparatus 102 may include a first jig 110', a second jig 120, a step difference portion 121, an elastic sheet 130, and a guide portion 140.

The first jig 110' may have at least one recessed portion 111. A surface of the first jig 110' facing the second jig 120 may be referred to as a first surface S1. A surface of the first jig 110' on the opposite side of the first surface S1 may be referred to as a second surface S2. The first jig 110' may have at least one recessed portion 111 in the first surface S1.

The first jig 110' according to an exemplary embodiment of the present invention may have an accommodating groove 117 in the first surface S1'. The first jig 110' may have the accommodating groove 117 in the first surface S1'. The accommodating groove 117 may contact an upper surface of the guide portion 140, for example, to accommodate a portion of the guide portion 140.

Accordingly, when the first jig 110' descends and/or the second jig 120 ascends to define and seal an inner space of the laminating apparatus 102, a distance between the first jig 110' and the second jig 120 may be substantially minimized. Further, since the distance between the first jig 110' and the second jig 120 may be reduced, an amount of change of the length of the elastic sheet 130 (e.g., the height of the elastic sheet 130 in a cross-sectional view) during the laminating process may be reduced.

A distance between an upper surface of the step difference portion 121 and a lower surface of the elastic sheet 130 in a maximum expansion state may be a third distance L3. When the accommodating groove 117 is not included, the third distance L3 may be smaller than the first distance L1. The third distance L3 may be smaller than the first distance L1, for example, by a depth of the accommodating groove 117. Accordingly, the amount of change of the length of the elastic sheet 130 (e.g., the height of the elastic sheet 130 in a cross-sectional view) when the first jig 110' includes the accommodating groove 117 may be less than the amount of change of the length of the elastic sheet 130 (e.g., the height of the elastic sheet 130 in a cross-sectional view) when the first jig 110' does not include the accommodating groove 117.

Thus, since the laminating apparatus 102 may include the accommodating groove 117 defined in the first surface S1 of the first jig 110', the amount of change of the length of the elastic sheet 130 (e.g., the height of the elastic sheet 130 in a cross-sectional view) may be substantially reduced during the laminating process. As the amount of change of the length of the elastic sheet 130 is reduced during the process, a change in the position of the display panel 12 on the elastic sheet 130 may be substantially reduced such that misalignment between the window panel 11 and the display panel 12 may be substantially reduced or prevented. As a result, the reliability of the curved display device 10 may be increased.

Figure 5A:
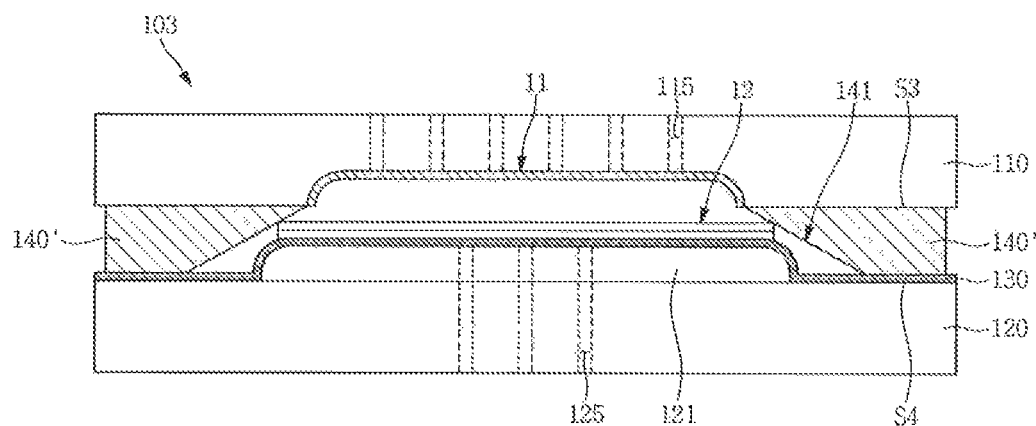
FIGS. 5A and 5B are views illustrating a laminating apparatus and a laminating method including the same according to an exemplary embodiment of the present invention.
Figure 5B:
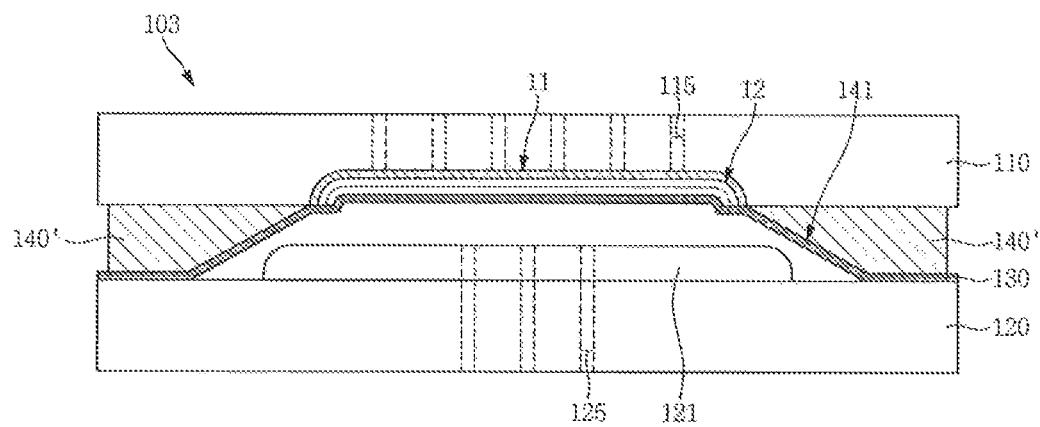

FIGS. 5A and 5B are views illustrating a laminating apparatus and a laminating method using the same according to an exemplary embodiment of the present invention. The descriptions of elements or configurations of the present invention previously described may be omitted.

Referring to FIGS. 5A and 5B, a laminating apparatus 103 may include a first jig 110, a second jig 120, a step difference portion 121, an elastic sheet 130, and a guide portion 140'.

The guide portion 140' may be spaced apart from the step difference portion 121. The guide portion 140' may overlap the elastic sheet 130. The guide portion 140' may be disposed along an edge of the elastic sheet 130. For example, the guide portion 140' may have a circular shape or a quadrangular ring shape. Thus, a space having a circular shape or a quadrangular shape may be defined by the guide portion 140'. For example, the step difference portion 121 and the display panel 12 may be disposed in the space. The step difference portion 121 and the display panel 12 may be spaced apart from the guide portion 140'.

According to an exemplary embodiment of the present invention, a contact area between the guide portion 140' and the first jig 110 may be larger than a contact area between the guide portion 140' and the elastic sheet 130. For example, referring to FIG. 5A, a contact surface between an upper surface of the guide portion 140' and a lower surface of the first jig 110 in an initial state may be referred to as a third surface S3. A contact surface between a lower surface of the guide portion 140' and an upper surface of the elastic sheet 130 may be referred to as a fourth surface S4. An area of the third surface S3 may be larger than an area of the fourth surface S4.

The guide portion 140' may include an inclined surface 141. The inclined surface 141 may contact a side portion of the display panel 12. As the inclined surface 141 of the guide portion 140' contacts an upper edge portion of the display panel 12, the display panel 12 may be fastened on the elastic sheet 130. Accordingly, a change in the position of the display panel 12 on the elastic sheet 130 may be substantially minimized during a laminating process. Additionally, a misalignment between the window panel 11 and the display panel 12 may be substantially reduced or prevented. The guide portion 140' may include the inclined portion 141; however, exemplary embodiments of the present invention are not limited thereto. For example, the guide portion 140' may have a C-shaped cross-section, e.g., a quadrilateral open-loop cross-section.

Referring to FIG. 5B, the elastic sheet 130 may expand along the inclined surface 141. A range of expansion of the elastic sheet 130 may be limited by the inclined surface 141 of the guide portion 140'.

Since the guide portion 140 may include the inclined surface 141, an amount of change of the length of the elastic sheet 130 may be reduced during the laminating process. As the amount of change of the elastic sheet 130 (e.g., the height of the elastic sheet 130 in a cross-sectional view) is reduced during the laminating process, a change in the position of the display panel 12 on the elastic sheet 130 may be substantially reduced. Thus, a misalignment between the window panel 11 and the display panel 12 may be substantially reduced or prevented.

Figure 6A:
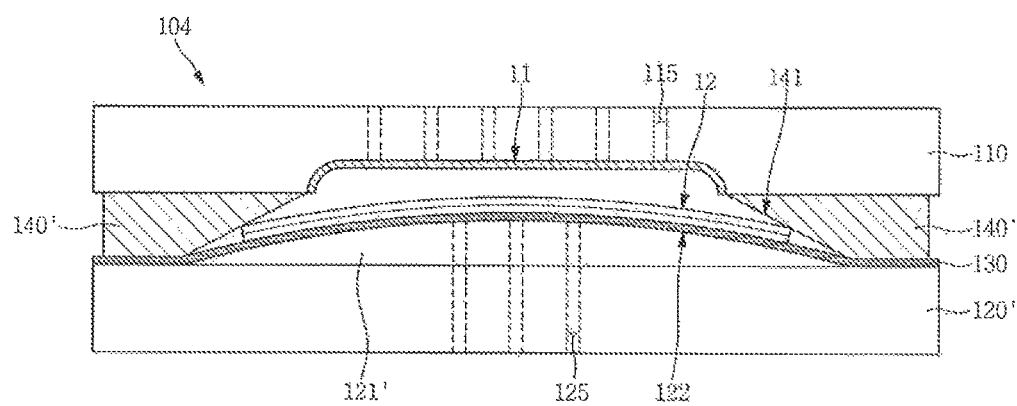
FIGS. 6A and 6B are views illustrating a laminating apparatus and a laminating method using the same according to an exemplary embodiment of the present invention.
Figure 6B:
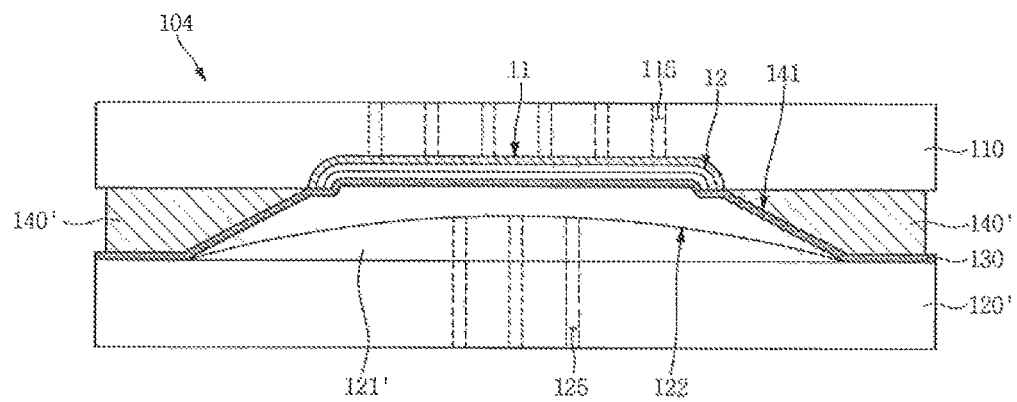

FIGS. 6A and 6B are views illustrating a laminating apparatus and a laminating method using the same according to an exemplary embodiment of the present invention. The descriptions of elements or configurations of the present invention previously described may be omitted.

Referring to FIGS. 6A and 6B, a laminating apparatus 104 according an exemplary embodiment of the present invention may include a first jig 110, a second jig 120', a step difference portion 121', an elastic sheet 130, and a guide portion 140'.

The second jig 120' may be disposed opposite to the first jig 110. The second jig 120' may have a planar plate shape. A horizontal area of the second jig 120' may be substantially equal to or greater than a horizontal area of the first jig 110.

The step difference portion 121' may be disposed on the second jig 120'. The step difference portion 121' may be a separate structure disposed on the second jig 120'; however, exemplary embodiments of the present invention are not limited thereto. The step difference portion 121' and the second jig 120' may be integrally formed.

The step difference portion 121' may be disposed at a central portion of the second jig 120'. The step difference portion 121' may have a third curved surface portion 122. The third curved surface portion 122 may support the display panel 12. The elastic sheet 130 may be disposed on the third curved surface portion 122 and the display panel 12. Referring to FIGS. 6A and 6B, the step difference portion 121' may have a parabolic shape on a cross-section; however, exemplary embodiments of the present invention are not limited thereto. The shape of the step difference portion 121' may be variously modified.

Accordingly, an amount of change of the length of the elastic sheet 130 (e.g., the height of the elastic sheet 130 in a cross-sectional view) between an initial state and a maximum expansion state may be reduced. Thus, as the amount of change of the length of the elastic sheet 130 is reduced during the laminating process, a change in the position of the display panel 12 on the elastic sheet 130 may be substantially reduced. Thus, misalignment between the window panel 11 and the display panel 12 may be substantially reduced or prevented.

According to one or more exemplary embodiments of the present invention, the laminating apparatus and the laminating method using the same may substantially reduce an amount of change of an elastic sheet. Thus, misalignment between laminating objects may be substantially reduced or prevented.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:

1. A laminating apparatus, comprising:
    a first jig having at least one recessed portion;
    a second jig disposed opposite to the first jig;
    a step difference portion disposed on the second jig;
    an elastic sheet disposed on each of the second jig and the step difference portion; and
    a guide portion spaced apart from the step difference portion and overlapping an edge of the elastic sheet, wherein a width of the step difference portion is greater than a width of the at least one recessed portion of the first jig.

2. The laminating apparatus of claim 1, further comprising a fluid regulating portion, wherein the fluid regulating portion supplies a fluid between the step difference portion and the elastic sheet, and the fluid supplied between the step difference portion and the elastic sheet adjusts a height of the elastic sheet.

3. The laminating apparatus of claim 1, wherein the first jig comprises at least one first hole, and
each of the second jig and the step difference portion comprises at least one second hole.

4. The laminating apparatus of claim 1, wherein the first jig comprises an accommodating groove disposed at a portion of the first jig aligned with the guide portion.

5. The laminating apparatus of claim 1, wherein the first jig fastens a first laminating object to the at least one recessed portion.

6. The laminating apparatus of claim 5, wherein the first laminating object comprises a substantially flat portion and a curved portion extending from the substantially flat portion.

7. The laminating apparatus of claim 5, wherein the first laminating object is a window panel.

8. The laminating apparatus of claim 5, wherein a second laminating object is disposed on the elastic sheet.

9. The laminating apparatus of claim 8, wherein the second laminating object is a display panel.

10. The laminating apparatus of claim 8, wherein a contact area between the guide portion and the first jig is larger than a contact area between the guide portion and the elastic sheet.

11. The laminating apparatus of claim 8, wherein the guide portion has an inclined surface, and the inclined surface contacts a side portion of the second laminating object.

12. The laminating apparatus of claim 1, wherein the step difference portion has a parabolic shaped cross-section.

13. The laminating apparatus of claim 1, wherein the step difference portion is integrally formed with the second jig.

14. A laminating method, comprising:
disposing a first laminating object on a first jig having at least one recessed portion;
disposing a second laminating object on a second jig and a step difference portion disposed on the second jig, wherein the second jig is disposed opposite to the first jig;
narrowing a gap between the first jig and the second jig; and
applying a pressure to the second laminating object by supplying a fluid to an area below an elastic sheet, wherein the elastic sheet is disposed on the second jig and the step difference portion,
wherein a width of the step difference portion is a greater than a width a width of the at least one recessed portion of the first jig.

15. The method of claim 14, wherein an edge of the elastic sheet is fastened to the second jig by a guide portion, and the guide portion is spaced apart from the step difference portion.

16. The method of claim 15, wherein the first jig comprises an accommodating groove disposed at a portion of the first jig aligned with the guide portion.

17. The method of claim 15, wherein the guide portion comprises an inclined surface, and the inclined surface contacts a side portion of the second laminating object.

18. The method of claim 14, further comprising vacuum-adsorbing the first laminating object using at least one first hole disposed in the first jig.

19. The method of claim 14, further comprising discharging the fluid supplied to the area below the elastic sheet.

20. The method of claim 14, wherein the step difference portion is integrally formed with the second jig.

21. A laminating apparatus, comprising:
a first jig including at least one accommodating groove;
a second jig disposed opposite to the first jig;
a step difference portion disposed on the second jig;
an elastic sheet disposed on each of the second jig and the step difference portion; and
a guide portion disposed on the elastic sheet, wherein the guide portion fastens a portion of the elastic sheet to the second jig,
wherein the at least one accommodating groove is disposed at a portion of the first jig aligned with the guide portion, and
wherein the at least one accommodating groove contacts an upper surface of the guide portion and accommodates the guide portion.

22. The laminating apparatus of claim 21, wherein the step difference portion and the second jig are integrally formed.

* * * * *